(12) United States Patent
Tsukada

(10) Patent No.: US 8,139,404 B2
(45) Date of Patent: Mar. 20, 2012

(54) SEMICONDUCTOR MEMORY DEVICE

(75) Inventor: Shuichi Tsukada, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 161 days.

(21) Appl. No.: 12/753,619

(22) Filed: Apr. 2, 2010

(65) Prior Publication Data
US 2010/0254184 A1   Oct. 7, 2010

(30) Foreign Application Priority Data

Apr. 3, 2009 (JP) .................. 2009-091325

(51) Int. Cl.
*G11C 11/00* (2006.01)
*G11C 7/10* (2006.01)

(52) U.S. Cl. ............ 365/163; 365/189.04; 365/189.05

(58) Field of Classification Search .......... 365/163, 365/189.04, 189.05, 148
See application file for complete search history.

(56) References Cited

U.S. PATENT DOCUMENTS

| | | | |
|---|---|---|---|
| 6,075,719 A | 6/2000 | Lowrey et al. | |
| 6,750,469 B2 | 6/2004 | Ichihara et al. | |
| 7,180,771 B2 | 2/2007 | Cho et al. | |
| 7,242,605 B2 | 7/2007 | Choi et al. | |
| 2008/0151656 A1* | 6/2008 | Nakai | 365/189.16 |
| 2008/0285336 A1* | 11/2008 | Osada et al. | 365/163 |

FOREIGN PATENT DOCUMENTS

| | | |
|---|---|---|
| JP | 2000-215684 A | 8/2000 |
| JP | 2003-502791 A | 1/2003 |
| JP | 2003-100085 A | 4/2003 |
| JP | 2004-362761 A | 12/2004 |
| JP | 2005-100617 | 4/2005 |
| JP | 2008-159178 A | 7/2008 |
| WO | 2005-041204 A1 | 5/2005 |

* cited by examiner

*Primary Examiner* — Andy Phung
(74) *Attorney, Agent, or Firm* — Sughrue Mion, PLLC

(57) ABSTRACT

The semiconductor memory device includes a control circuit that performs control of reading data from and writing data into each memory cell. The control circuit includes a flip-flop circuit that stores the data read from the memory cell and stores the data to be written into the memory cell and a dynamic type holding circuit connected to the flip-flop circuit through a switch. The dynamic-type holding circuit temporarily stores the data read from the memory cell. When the data read from the memory cell and then held in the holding circuit is different from the data in the flip-flop circuit to be written, supplied from an outside at a time of writing into the memory cell, control is performed so that the data in the flip-flop circuit is written into the memory cell.

18 Claims, 5 Drawing Sheets

SEMICONDUCTOR MEMORY DEVICE

TECHNICAL FIELD

Reference to Related Application

This application is based upon and claims the benefit of the priority of Japanese patent application No. 2009-091325, filed on Apr. 3, 2009, the disclosure of which is incorporated herein in its entirety by reference thereto.

The present invention relates to a semiconductor memory device. More specifically, the invention relates to a non-volatile semiconductor memory device such as a phase-change memory.

BACKGROUND

In the field of semiconductor memory devices, in addition to volatile memories such as a DRAM and an SRAM, various types of non-volatile semiconductor memory devices including a flash memory, an MRAM, and an FeRAM have been developed. In the volatile memories, when a power supply is disconnected, information is lost. The flash memory utilizes a floating gate. These non-volatile semiconductor memory devices can store information even if a power supply has been disconnected. The phase-change memory among these semiconductor memory devices is drawing attention because the time necessary for erasing a write in the phase-change memory is short. The phase-change memory is a memory of which a material capable of being electrically programmed to assume an amorphous state or a crystalline state is used for a part of a memory cell. In this memory, it is determined whether the material is in the amorphous state or in the crystalline state by a resistance value of the memory cell, thereby reading data.

Assume that memory cell data before rewritten and external write data from an outside for rewriting the memory cell data are identical in the above-mentioned phase-change memory. In this case, a resistance value can be made stable by not performing writing. Though not limited to the phase-change memory alone, when unnecessary writing is not performed, the life of the memory cell can be extended, and a program current can be reduced. The following proposals have been made from this point of view.

Patent Document 1 describes a phase-change memory including phase-change memory elements. In each phase-change memory element, a high-resistance state and a low-resistance state can be electrically programmed. Then, a current state of the memory element is read. When the current state is different from a state to be programmed, the programming is performed.

Patent Document 2 describes a phase-change memory in which a storage state of the phase-change memory is read from a rising waveform of a write pulse. When the storage state coincides with information to be written, rewrite processing is stopped.

FIG. 11 and FIGS. 22 to 24 of Patent Document 3 respectively disclose circuits where control is performed to stop writing on a memory cell of which data has been changed from "0" to "1" (of which the threshold has been increased). This control is performed during a repeated operation of writing caused by electron injection (FN tunneling) and verification in NAND-EEPROMs.

FIGS. 5 and 6 of Patent Document 4 describe a phase-change memory in which a read data latch, a write data latch, and a transfer switch are provided. The read data latch holds data read from a cell and write data. The write data latch holds the data written into the cell. The transfer switch controls transfer from the read data latch to the write data latch. When the contents of the read data latch and the write data latch do not match, writing is performed using the write data latch.

[Patent Document 1]
 JP Patent Kohyou Publication No. JP-P2003-502791A, which corresponds to US Patent Publication No. U.S. Pat. No. 6,075,719A.
[Patent Document 2]
 International Publication No. WO2005/041204 A1
[Patent Document 3]
 JP Patent Kokai Publication No. JP-P2000-215684A
[Patent Document 4]
 JP Patent Kokai Publication No. JP-P2008-159178A, which correspond to US Patent Application Publication US2008/151656A1.
[Patent Document 5]
 JP Patent Kokai Publication No. JP-P2003-100085A, which correspond to US Patent Application Publication US2003/067013A1.
[Patent Document 6]
 JP Patent Kokai Publication No. JP-P2005-100617A, which correspond to US Patent Application Publication US2005/068804A1.
[Patent Document 7]
 JP Patent Kokai Publication No. JP-P2004-362761A, which correspond to US Patent Application Publication US2004/246804A1.

SUMMARY

The entire disclosures of Patent Documents 1 to 7 and the above-mentioned corresponding US Patent Publications are incorporated herein by reference thereto.

The following analyses are given by the present invention. Patent Document 1 mentioned above describes that writing should not be performed when data before rewriting is identical to data after the rewriting. A specific circuit for that purpose is not described. In Patent Document 2, determination as to whether writing should be performed is made using a rise of the write pulse. Thus, a stress is applied also when the writing is not needed. According to Patent Document 3, it can be controlled so that writing is not performed any more on a memory cell of which data has been changed from "0" to "1". However, this circuit cannot be applied to the case of a bidirectional change of data from "1" to "0". None of Patent Documents 1 to 6 mentioned above disclose a semiconductor memory device where writing is performed only to a bit of which data is to be changed by the writing, without increasing the circuit size.

A semiconductor memory device according to one aspect of the present invention comprises a memory cell array including a plurality of memory cells, and a control circuit that performs control of reading data from and writing data into each of the memory cells. The control circuit comprises a flip-flop circuit that stores the data read from the memory cell and stores the data from an outside to be written into the memory cells, and a dynamic type holding circuit connected to the flip-flop circuit through a switch. The dynamic type holding circuit temporarily stores the data read from the memory cells. The control circuit writes the data in the flip-flop circuit into the memory cells when the data read from the memory cells and then held in the holding circuit is different from the data in the flip-flop circuit to be written, supplied from the outside at a time of writing into the memory cells.

A semiconductor memory device according to another aspect of the present invention comprises a plurality of memory cell arrays arranged in a matrix form, each of the memory cell arrays including a plurality of memory cells connected to a plurality of word lines and a plurality of bit lines, respectively. The semiconductor memory device further comprises a plurality of bit line control circuits respectively disposed corresponding to the memory cell arrays, each of the bit line control circuits performing control so that data in a corresponding one of the memory cells is read and written through each bit line. The semiconductor memory device further comprises a plurality of data lines connected in common to a plurality of the bit line control circuits respectively arranged in a first direction, the first direction being an extending direction of the bit lines and a plurality of bit line control signal generation circuits connected in common to a plurality of the bit line control circuits respectively arranged in a second direction, the second direction being an extending direction of the word lines. Each of the bit line control circuits in the first direction includes a plurality of control circuits each connected to a different one of the data lines and different ones of the bit lines of a corresponding one of the memory cell arrays. Each of the control circuits comprising: a flip-flop circuit that stores the data read from the corresponding one of the memory cells and stores data from an outside to be written into the corresponding one of the memory cells; and a dynamic type holding circuit that is connected to the flip-flop circuit through a switch and temporarily holds the data read from the corresponding one of the memory cells. At a time of writing into the corresponding one of the memory cells, each of the control circuits writes the data in the flip-flop circuit into the corresponding one of the memory cells when the data read from the corresponding one of the memory cells and then held in the holding circuit is different from the data from the outside to be written, stored in the flip-flop circuit. A signal that controls conduction of the switch and a signal that controls a timing signal of writing the data in the flip-flop circuit into the corresponding one of the memory cells are connected in common to a plurality of the control circuits included in each of the bit line control circuits extending from each of the bit line control signal generation circuits in the second direction.

The meritorious effects of the present invention are summarized as follows.

The present invention can implement the semiconductor memory device where writing is performed only to a bit whose data is to be changed by the writing, with a small area for the control circuits.

PREFERRED MODES

Figure 1:
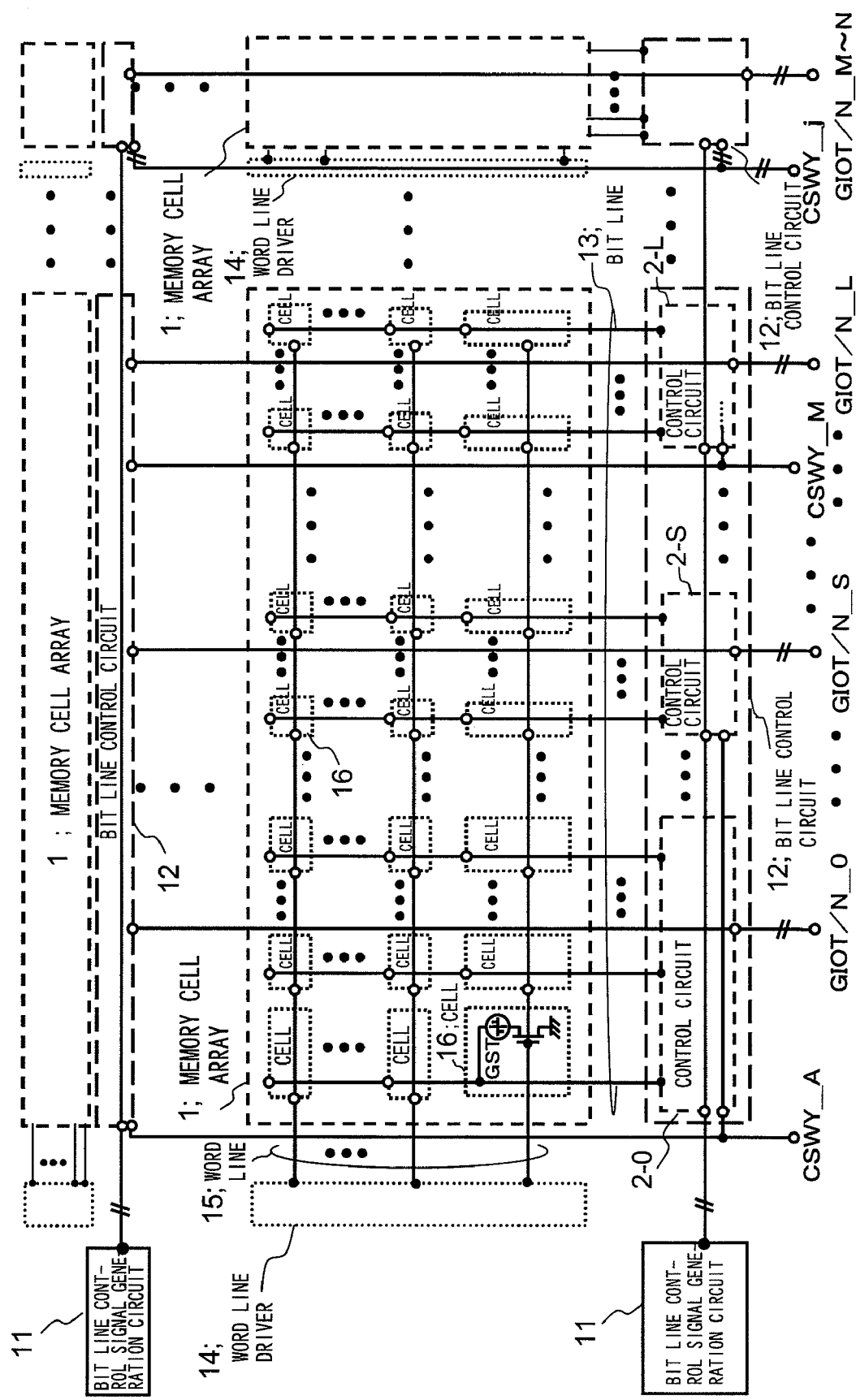
FIG. 1 is a block diagram showing a main portion of a semiconductor memory device according to an example of the present invention.

An overview of the present invention will be described with reference to drawings, as necessary. The drawings and reference characters of the drawings cited in the description of the overview are shown as an example of an exemplary embodiment, and do not thereby limit a variation of the exemplary embodiment of the present invention. Needless to say, the claimed content of this application is not limited to this overview, and is described in the claims of this application.

A write operation into a flip-flop circuit 3 from an outside due to execution of a write command will be hereinafter referred to as "writing", and a write operation into a memory cell 16 from the flip-flop circuit 3 will be referred to as "programming". A data read operation from the flip-flop circuit 3 to the outside due to execution of a read command will be referred to as "reading", while a read operation from the memory cell 16 to the flip-flop circuit 3 will be referred to as "sensing". Writing without limiting a target includes "writing" and "programming". Reading without limiting a target includes "sensing" and "reading".

A semiconductor memory device 100 of the present invention comprises a control circuit 2. The control circuit 2 includes a flip-flop circuit 3 that stores data read from a memory cell of a memory cell array 1 at a time of a reading operation and stores data to be written into the memory cell of the memory cell array 1 at a time of a writing operation, and a holding circuit (S1, R1) connected to the flip-flop circuit 3 through a switch (TGS1, TGR1) that turns off (stop conducting) at the time of the writing operation and temporary holds the data in the flip-flop circuit 3 before the writing operation. The control circuit 2 performs control so that at the time of the writing into the memory cell of the memory cell array 1, the data to be written is stored in the flip-flop circuit 3. Then, the control circuit 2 performs control so that the data in the flip-flop circuit 3 is written into the memory cell of the memory cell array 1 when the data held in the holding circuit (S1, R1) is different from the data in the flip-flop circuit 3. Data writing into the memory cell of the memory cell array and data reading from the memory cell of the memory cell array are performed through the flip-flop circuit 3. The holding circuit (S1, R1) holds data before written into the flip-flop circuit 3 only during execution of programming into the memory cell 16. According to the above configuration, the holding circuit should hold the data only during execution of programming into the memory cell, and does not need holding for a period of time longer than that for execution of programming. Accordingly, the data can be held using only parasitic capacitances such as gate capacitances, wiring capacitances, and diffusion layer capacitances of the switches (TGS1, TGR1). Thus, the holding circuit is a dynamic type holding circuit capable of temporarily storing information. The term "dynamic" denotes transition of a held voltage with passage of time. The term "temporarily" denotes, for example, a period from an input of a predetermined voltage indicating information 1 to a time at which the voltage transitions to cause the information 1 to be changed to information 0 due to transient characteristics or the like. In this application, the term "temporarily" period may denote at least a program period corresponding to a program execution period, or a period obtained by adding a "period where a write command is received after sensing" to the program period. There is no additional need for providing a latch circuit that is disclosed in Patent Document or the like and holds data in a static manner (static type holding circuit capable of holding information as long as a power supply is not disconnected). Accordingly, when data sensed from a memory cell is sensed into the flip-flop circuit before written into the memory cell, it can be determined whether or not programming into the memory cell needs to be performed by a simple circuit of the above configuration. The control circuits can be disposed at predetermined pitches of bit lines (GBLs). The pitches of bit lines (GBLs) can be reduced more than in any memories or circuit of Patent Document 1 to 6.

A plurality of the control circuits (2-0, 2-S, 2-L) are provided in one memory cell array 1 of the semiconductor memory device of the present invention in one exemplary embodiment. The control circuits are respectively connected to different bit lines 13 of the memory cell array 1 (through a common bit line GBL1 and a bit line selection circuit 5). When an active (ACT) command is supplied from the outside, data read in parallel from the bit lines connected to the respective control circuits (2-0, 2-S, 2-L) is stored in the flip-flop circuits of the respective control circuits. Then, when a write command is supplied from the outside, data to be written is stored in the predetermined number of the flip-flop circuits of the control circuits specified by the write command. Further, the data stored in the predetermined number of the flip-flop circuits is written into corresponding one or more memory cells of the memory cell array. That is, when the active command is supplied, the data sensed from the memory cell of the memory cell array is stored in each flip-flop circuit. Accordingly, if a row address does not be changed after supply of the active command, memory cell data of the row address to be programmed is stored in the flip-flop circuit when the write command is executed. Accordingly, programming can be performed into only the memory cell whose data is to be rewritten.

Assume that only a part of the flip-flop circuits are targeted for writing. Then, when the writing is performed into the part of the flip-flop circuits alone, there is no particular need for a circuit that selects from among the flip-flop circuits the flip-flop circuits targeted for writing and performs the writing in order to perform programming into memory cells from the flip-flop circuits. The reason for elimination of the need is that, according to the semiconductor memory device of the present invention, programming into the memory cells is performed only from the flip-flop circuits where data has been rewritten by writing.

The semiconductor memory device of the present invention in one exemplary embodiment includes data input/output switch circuits 4 which connect the flip-flop circuits 3 and data lines (GIOT/N_0 to GIOT/N_N). Turning on or off (conduction/nonconduction) of each data input/output switch circuit 4 is controlled by column selection signals (CSWX_a, CSWY_A) corresponding to the data input/output switch circuit 4. At a time of a writing operation, the data input/output switch circuit 4 which is selected by the column selection signals (CSWX_a, CSWY_A) according to a write command turns on (conduct), and data on a corresponding one of the data lines (GIOT/N_0 to GIOT/N_N) is stored in a corresponding one of the flip-flop circuits 3. That is, programming into the memory cell 16 of the memory cell array 1 is performed only from the flip-flop circuit 3 on which writing has been performed by selecting the data input/output switch circuit 4 according to the column selection signals (CSWX_a, CSWY_A). Description about examples will be given below in detail with reference to drawings.

FIRST EXAMPLE

Figure 4:
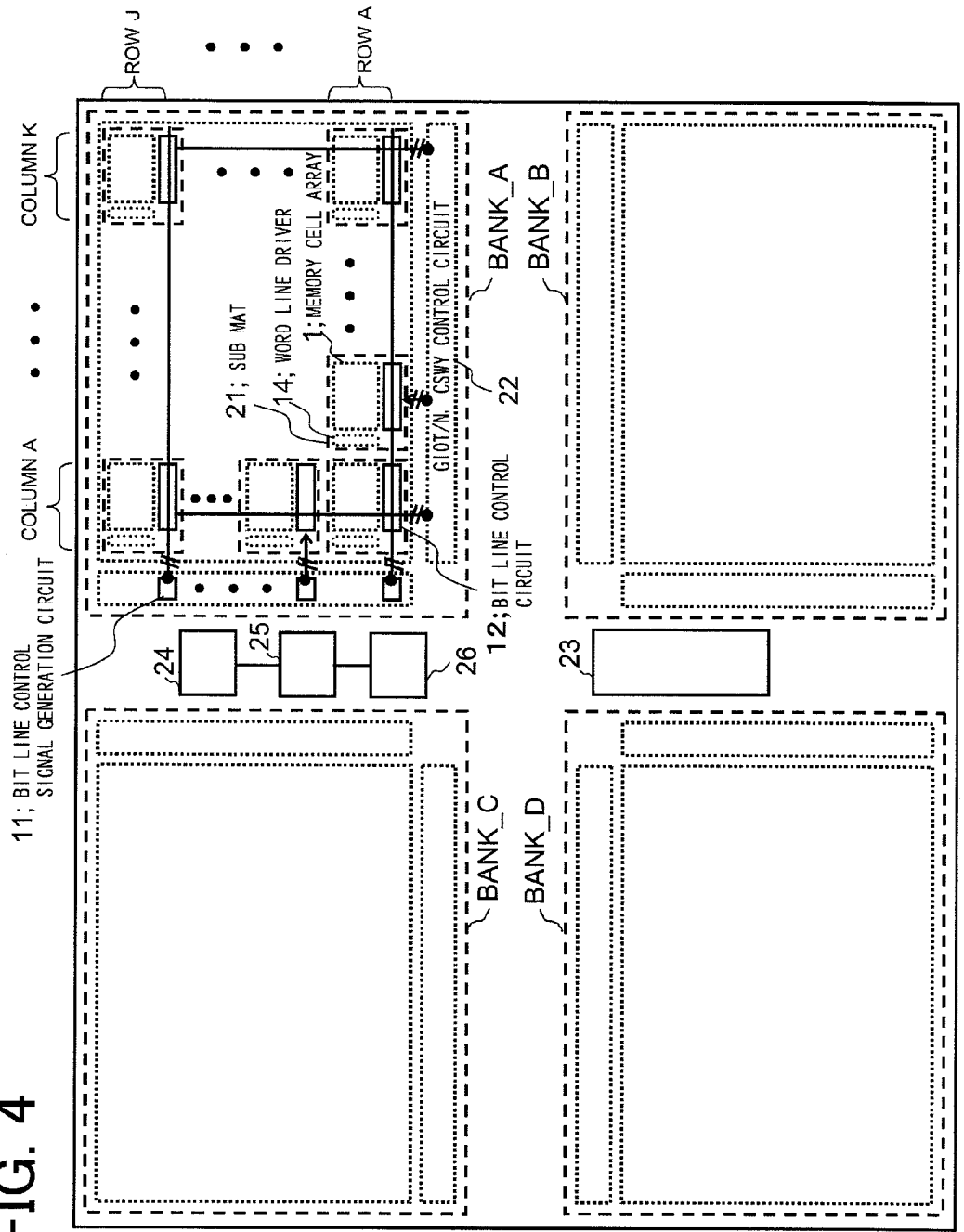
FIG. 4 is a plan view of an entirety of the semiconductor memory device according to the example of the present invention.

FIG. 4 is a plan view showing an entire chip of a semiconductor memory circuit device 100 according to a first example. Though not limited in particular, the semiconductor memory device 100 in the first example of the present invention is a phase-change memory device that is compatible with a DDRSDRAM (Double Data Rate Synchronous DRAM). The semiconductor memory device 100 includes four banks of Bank_A to Bank_D. A bank denotes a region in which a plurality of memory arrays included in the memory device can be accessed from an outside under non-exclusive control. In an internal bank configuration of the Bank_A that is shown, sub mats 21 are arranged in a matrix form in a total of J rows from a row A to a row J in a bit line extending direction and in a total of K columns from a column A to a column K in a word line extending direction. For each sub mat 21, a memory cell array 1, a word line driver 14, and a bit line control circuit 12 are provided. A plurality of memory cells are arranged on the memory cell array 1 in an array form (matrix form). The word line driver 14 drives plural word lines 15 of the memory cell array 1 (See FIG. 1). The bit line control circuit 12 selects plural bit lines and performs programming and sensing of data on memory cells 16 of the memory cell array 1. A plurality of bit line control signal generation circuits 11 are respectively arranged at ends of the rows (in the word line extending direction) of the sub mats 21 provided in the matrix form. The bit line control signal generation circuits 11 corresponding to the respective rows are arranged in the column direction (bit line extending direction), and are respectively connected to the bit line control circuits 12 in the respective rows. A GIOT/N, CSWY control circuit 22 is provided at ends of the respective columns of the sub mats 21 (in the bit line extending direction) provided in the matrix form. From the GIOT/N, CSWY control circuit 22, a plurality of data lines GIOT/N are respectively connected to a plurality of the bit line control circuits 12 in the corresponding columns.

Referring to FIG. 4, the above configuration of the BANK_A alone is shown. Internal configurations of other banks also have the same internal configuration. In a region where the respective banks of the semiconductor memory device 100 are not arranged, an input/output buffer circuit 23, a clock generator 24, a command decoder 25, and a control circuit 26, and the like are disposed. The input/output buffer circuit 23 receives an address signal and a command from the outside, and receives/outputs read/write data.

FIG. 1 is a block diagram showing internal configurations of the memory cell array 1 and the bit line control circuits 12 for the memory cell array 1 in one of the banks in FIG. 4. A plurality of word lines 15 are routed to the memory cell array 1 from the word line driver 14. A plurality of bit lines 13 are routed in a direction orthogonal to the plurality of word lines 15 and are connected to the bit line control circuit 12. Further, at intersections of the plurality of word lines 15 and the plurality of bit lines 13, the memory cells 16 are respectively arranged. Each memory cell 16 is constituted from a GST (Ga—Sb—Te; phase-change element) and a cell transistor. The GST is connected between the bit line 13 and a drain of the cell transistor. A source of the cell transistor is connected to the ground, while a gate of the cell transistor is connected to the word line 15.

L control circuits 2-0 to 2-L are provided at the bit line control circuit 12, and a common control signal line is routed to the L control circuits 2 from the bit line control signal generation circuit 11. Some of the bit lines 13 routed from the memory cell array 1 are connected to each control circuit 2. The control signal line routed from the bit line control signal generation circuit 11 is routed to the control circuits 2 of other bit line control circuits 12 arranged in a row direction, as well. Further, a common column selection signal CSWY_A is connected to S control circuits 2-0 to 2-S of the L control circuits 2 included in one bit line control circuit 12. That is, one column selection signal CSWY_j is connected for every S control circuits 2 in the row direction. This column selection signal CSWY_j is connected to the control circuits 2 of other bit line control circuits 12 arranged in the column direction, as well. Further, the corresponding data line GIOT/N is connected to each control circuit 2. The data line GIOT/N is connected to the control circuits 2 of the other bit line control circuits 12 arranged in the column direction, as well.

In addition to the column selection signal (CSWY_A, K) that is output from the GIOT/N, CSWY selection circuit 22 (See FIG. 4) and is routed in the column direction, there is a column selection signal (CSWX_a, which will be described later) that is included in the control signal line output from the bit line control signal generation circuit 11 and is routed in the row direction. The control circuit 2 (one of the control circuits 2-0, 2-S, and 2-L that does not need to be specified) selected by both of the column selection signal routed in the row direction and the column selection signal routed in the column direction performs data reading or writing with the data line GIOT/N (one of the data lines GIOT/N_0, GIOT/N_S, and GIOT/N_L that does not need to be specified).

This control circuit 2 includes a function of selectively writing data supplied to the data line GIOT/N from the outside in response to a write command according to the column selection signals and then programming the written data into the memory cell 16 of the memory cell array 1 according to control signals supplied from the bit line control signal generation circuit 11. The control circuit 2 further achieves a function of outputting to the data line GIOT/N data that has been sensed from the memory cell 16 of the memory cell array 1 into the control circuit 2 in response to a read command.

Figure 2:
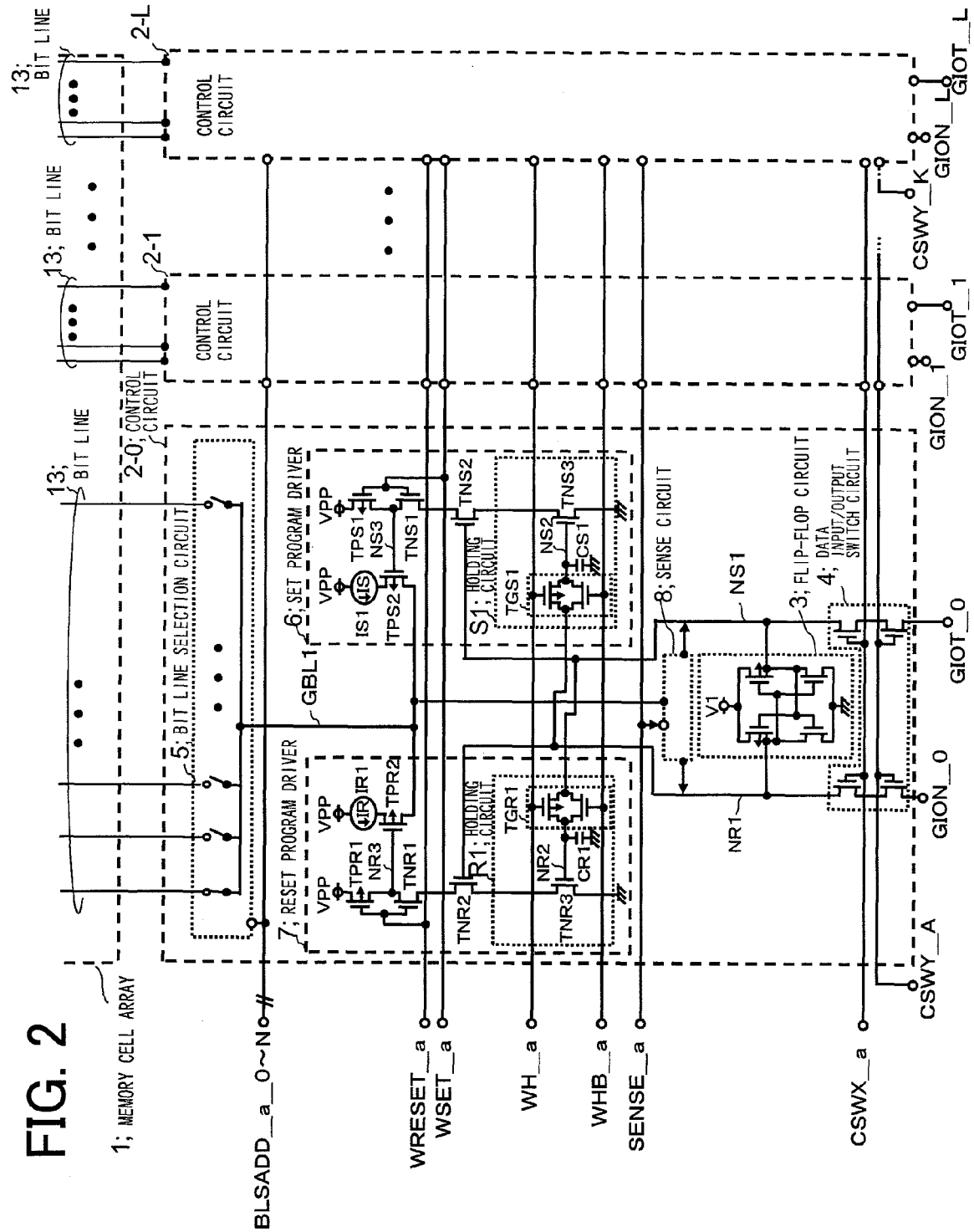
FIG. 2 is a block diagram showing a configuration of a control circuit in the semiconductor memory device according to the example of the present invention.

Next, an internal configuration of the control circuit 2 will be described in further detail, with reference to FIG. 2. FIG. 2 is a block diagram showing a configuration of the control circuit in the semiconductor memory device 100 in the first example. The control circuit 2 is connected to the data line GIOT/N through a data input/output switch circuit 4. Each data line GIOT/N is a pair of signal lines constituted from a non-inverting data signal GIOT and an inverting data signal GION.

The column selection signals CSWX_j and CSWY_j are connected to the data input/output switch circuit 4 as control signals. The column selection signal CSWX_j is a signal controlled by the bit line control signal generation circuit 11. The column selection signal CSWY_j is a signal controlled by the GIOT/N, CSWY selection circuit 22 (See FIG. 4). The column selection signals CSWX_j and CSWY_j are routed in directions that are orthogonal to each other, and are respectively activated according to an input column address. For that reason, the data input/output switch circuit 4 at the intersection of the activated column selection signals CSWX_j and CSWY_j turns on (conducts). When a read command is executed, data is read into the data line GIOT/N from the data input/output switch circuit 4 selected by the column selection signals CSWX_j and CSWY_j. When a write command is executed, data is written into the control circuit 2 from the data line GIOT/N through the data input/output switch circuit 4 selected by the column selection signals CSWX_j and CSWY_j.

One column selection signal CSWY_j is connected to the S control circuits 2 in the row direction. Thus, when the column selection signals CSWX_j and CSWY_j are respectively activated, the S control circuits 2 can be simultaneously selected, and reading or writing of S bits can be simultaneously performed. When one column selection signal CSWX_j and a plurality of the column selection signals CSWY_j, e.g. four column selection signals CSWY_j are activated, 4× S bits can be simultaneously read or written.

The data line GION/T is connected to a flip-flop circuit 3 provided inside the control circuit 2 through the data input/output switch circuit 4. The non-inverting signal GIOT on the data line GIOT/N is connected to a node NS1 of the flip-flop circuit 3. The inverting signal GION on the data line GIOT/N is connected to a node NR1 of the flip-flop circuit 3. The flip-flop circuit 3 is constituted from two CMOS inverters with gates thereof mutually connected to drains thereof. In addition to the configuration written on FIG. 2, the flip-flop circuit 3 may have an arbitrary internal configuration if the flip-flop circuit 3 can hold written or sensed data.

The bit lines 13 are connected to bit line selection circuits 5. The bit line 13 selected by bit line address signals BLSADD_a_0 to N is connected to a common bit line GBL1 in the control circuit 2. The bit line 13 selected by the bit line selection address signals BLSADD_a_0 to N is determined when a row address is determined to select the word line 15 according to a bank active (ACT) command or the like. The bit line 13 selected by the bit line selection address signals BLSADD_a_0 to N remains unchanged until selection of the word line 15 is canceled.

The common bit line GBL1 is connected to a sense circuit 8. A sense timing signal SENSE_a output by the bit line control signal generation circuit 11 is further connected to the sense circuit 8. Then, output signals of the sense circuit 8 are connected to the nodes NR1 and NS1 of the flip-flop circuit 3.

A set program driver 6 and a reset program driver 7 are provided at the control circuit 2. The set program driver 6 and the reset program driver 7 generate a set program pulse and a reset program pulse for the memory cell 16, respectively. The set program driver 6 includes a holding circuit S1 that temporarily holds data in the flip-flop circuit 3 before written into an inside. The holding circuit S1 further includes a switch TGS1 constituted from a CMOS transmission gate in its inside. The switch TGS1 is constituted from a PMOS transfer gate and an NMOS transfer gate. Data holding instruction signals WH_a and WHB_a output by the bit line control signal generation circuit 11 are connected to gates of the PMOS transfer gate and the NMOS transfer gate, respectively. The switch TGS1 is connected between the node NR1 of the flip-flop circuit 3 and a gate of an NMOS transistor TNS3. Reference character CS1 denotes a holding capacitance, and is a parasitic capacitance accompanying a node NS2. A capacitor element that is adjusted by an NMOS transistor and/or a PMOS transistor or a metal capacitance or the like may be further added to the holding capacitance CS1 in view of a program time, noise, and the like.

A source of the NMOS transistor TNS3 is connected to the ground. A drain of the NMOS transistor TNS3 is connected to a source of an NMOS transistor TNS2. A gate of the NMOS transistor TNS2 is connected to the node NS1 of the flip-flop circuit 3. A drain of the NMOS transistor TNS2 is connected to a source of an NMOS transistor TNS1. Gates of the NMOS transistor TNS1 and a PMOS transistor TPS1 are connected in common, and drains of the NMOS transistor TNS1 and the PMOS transistor TPS1 are connected in common. The gates of the NMOS transistor TNS1 and the PMOS transistor TPS1 are connected to a set program timing signal WSET_a output by the bit line control signal generation circuit 11. The drains of the NMOS transistor TNS1 and the PMOS transistor TPS1 are connected to a gate of a PMOS transistor TPS2. A source of the PMOS transistor TPS1 is connected to a programming power supply VPP. A drain of the PMOS transistor TPS2 is connected to the common bit line GBL1. A source of the PMOS transistor TPS2 is connected to a current source circuit IS1. Power is supplied to the current source circuit IS1 from the programming power supply VPP.

The reset program driver 7 also includes a holding circuit R1 that temporarily holds data in the flip-flop circuit 3 before written into the inside, like the set program driver 6. The holding circuit R1 includes a switch TGR1 constituted from a CMOS transmission gate in its inside. The switch TGR1 is constituted from a PMOS transfer gate and an NMOS transfer gate, like the switch TGS1. The data holding instruction signals WH_a and WHB_a output by the bit line control signal generation circuit 11 are connected to gates of the PMOS transfer gate and the NMOS transfer gate, respectively. The switch TGR1 is connected between the node NS1 of the flip-flop circuit 3 and a gate of an NMOS transistor TNR3. Reference character CR1 denotes a holding capacitance, and is a parasitic capacitance accompanying a node NR2. A capacitor element that is adjusted by an NMOS transistor and/or a PMOS transistor or a metal capacitance or the like may be further added to the holding capacitance CR1 in view of a program time, noise, and the like.

A source of the NMOS transistor TNR3 is connected to the ground. A drain of the NMOS transistor TNR3 is connected to a source of an NMOS transistor TNR2. A gate of the NMOS transistor TNR2 is connected to the node NR1 of the flip-flop circuit 3. A drain of the NMOS transistor TNR2 is connected to a source of an NMOS transistor TNR1. Gates of the NMOS transistor TNR1 and a PMOS transistor TPR1 are connected in common, and drains of the NMOS transistor TNR1 and the PMOS transistor TPR1 are connected in common. The gates of the NMOS transistor TNR1 and the PMOS transistor TPR1 are connected to a reset program timing signal WRESET_a output by the bit line control signal generation circuit 11. The drains of the NMOS transistor TNR1 and the PMOS transistor TPR1 are connected to a gate of a PMOS transistor TPR2. A source of the PMOS transistor TPR1 is connected to the programming power supply VPP. A drain of the PMOS transistor TPR2 is connected to the common bit line GBL1. A source of the PMOS transistor TPR2 is connected to a current source circuit IR1. Power is supplied to the current source circuit IR1 from the programming power supply VPP.

The control signals connected in common to the control circuits 2 arranged from the bit line control signal generation circuit 11 in the row direction, which were described with reference to FIG. 1, include the bit line selection address signals BLSADD_a_0 to a_N, reset program timing signal WRESET_a, set program timing signal WSET_a, data holding instruction signals WH_a, WHB_a, sense timing signal SENSE_a, and column selection signal CSWX_a routed in the row direction.

Next, an operation of the first example will be described, using a timing diagram in FIG. 3. First, when the ACT (bank active) command is supplied as an external command, a selected one of the banks is activated. A specific one of the word lines 15 is activated according to a given row address, and current flows through the bit line selected by the bit line selection address selection signals BLSADD_a_0 to N, from a plurality of the memory cells connected to the same word line. It is assumed that the row address for the memory cell array 1 and states of the word line 15 and the bit line selection address signals BLSADD_a_0 to N remain unchanged thereafter until execution of a precharge command "PRE".

Figure 3:
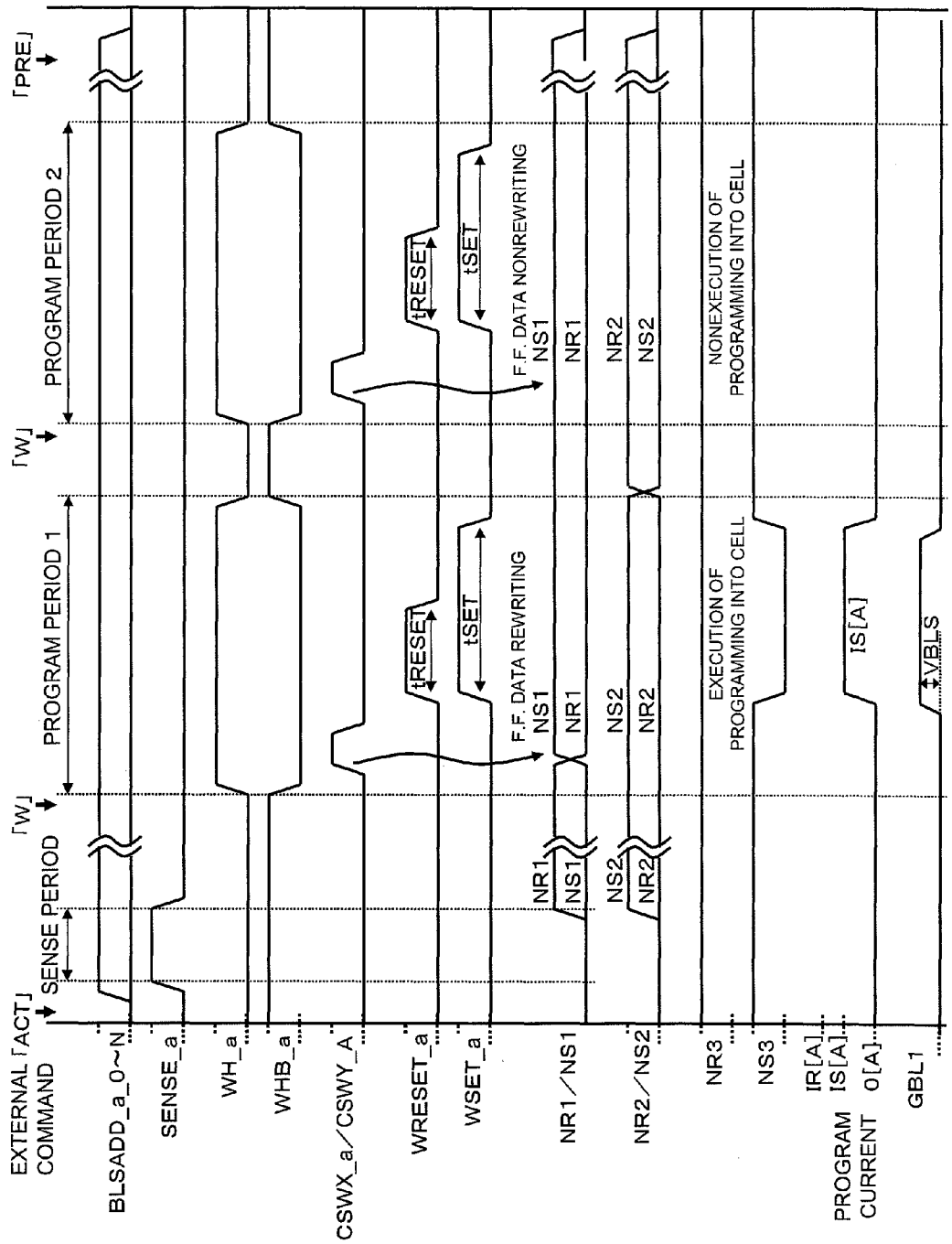
FIG. 3 is a timing diagram at a time of a writing operation in the semiconductor memory device according to the example of the present invention.

Next, referring to FIG. 3, when the sense timing signal SENSE_a goes high, the sense circuit 8 is activated to compare current flowing through the bit line with a reference value, thereby determining data in the memory cell 16 is 0 or 1 according to whether the current flowing through the bit line is larger or smaller than the reference value. It is assumed that the nodes NR1 and NS1 are set at a same potential by an equalizer circuit not shown before the sense timing signal SENSE_a goes high. In the case of a phase-change memory, the GST of the memory cell 16 assumes a high resistance in an amorphous state, and assumes a low resistance in a crystalline state. Thus, depending on the state of the GST, the current flowing through the bit line varies. In this case, the GST of the pertinent memory cell 16 is in the amorphous state and assumes a high resistance. Thus, the sense circuit 8 determines that the current flowing through the bit line is smaller than the reference value. Then, the sense circuit 8 sets the node NR1 to be high and sets the node NS1 to be low. A state of the flip-flop circuit 3 is also set according to the output signals of the sense circuit 8. The data holding instruction signal WH_a is low and the data holding instruction signal WHB_a is high during a period other than a program period. Thus, the switches TGS1 and TGR1 both turn on (conduct). Accordingly, the node NS2 of the holding circuit S1 is brought into the same potential as the node NR1, and the node NR2 of the holding circuit R1 is brought into the same potential as the node NS1.

As described using FIG. 1, L control circuits 2 or L sense circuits 8 are present in one bit line control circuit 12. As described using FIG. 4, K columns of sub mats are present in one bank. Accordingly, when one row of sub mats is activated, L×K column bits are simultaneously sensed. As shown in FIG. 4, j rows of sub mats are present in one bank. When only N sub mat rows are activated according to a row address, and the number of N rows is set so that L×K columns×"N sub mat rows"=16K by the ACT command, 16K cells are sensed by the ACT command. Then, sensed data is respectively stored in the corresponding flip-flop circuits 3 of 16K control circuits 2.

When a write command "W" is supplied from the outside, a program period 1 is entered. In the program period 1, the data holding instruction signal WH_a goes high, and the data holding instruction signal WHB_a goes low. Then, the switches TGS1 and TGR1 both turned off (stop conducting). Accordingly, the nodes NS2 and NR2 of the holding circuits S1 and R1 maintain states immediately before the program period 1.

After the program period 1 has been entered, each of the column selection signals CSWX_a and CSWY_A outputs a high-level pulse. The data input/output switch circuit 4 to which the column selection signals CSWX_a and CSWY_A are connected turns on (conducts), and data on the corresponding data lines GIOT_i and GION_i is written into the flip-flop circuit 3. Due to this writing, data in the flip-flop 3 is inverted, and the node NR1 is changed from high to low, while the node NS1 is changed from low to high. On the other hand, the nodes NS2 and NR2 remain unchanged because the switches TGR1 and TGS1 turn off (stop conducting).

Next, the reset program timing signal WRESET_a and the set program timing signal WSET_a are output from the bit line control signal generation circuit 11. Then, all the NMOS transistors TNS1, TNS2, and TNS3 connected in series in three stages in the set program driver 6 turn on (conduct), and the PMOS transistor TPS1 turns off (stops conducting). Accordingly, only in a period in which the set program timing signal WSET_a goes high, a node NS3 goes low. The node NS3 goes low, and the PMOS transistor TPS2 thereby turns on (conducts). A set program current IS[A] flows through the GST of the selected memory cell 16 through the common bit line GBL1, bit line selection circuit 5, and bit line 13 from the current source circuit IS1. Then, the GST changes from the amorphous state (high resistance) to the crystalline state (low resistance) by heat generated by flow of the current. Further, due to flow of the set program current IS[A] through the common bit line GBL1, the potential of the common bit line GBL1 rises by VBLS. When the set program timing signal WSET_a falls, the program is finished, and the set program current IS[A] also returns to 0[A]. In the reset program driver 7, none of the NMOS transistors TNR2 and TNR3 turn on (conduct). Thus, no program current flows from the reset program driver 7.

Whether the GST (phase-change element) assumes the amorphous state or the crystalline state is determined by a temperature profile due to the heat generated when current is flown. When a large current is flown for a short period, the GST changes from the crystalline state to the amorphous state. When a comparatively small current is flown for a comparatively long period, the GST changes to the crystalline state. Accordingly, the current source circuit IS1 of the set program driver 6 that outputs the program current which changes the GST of the memory cell 16 to the crystalline state is set to output current smaller than the current source circuit IR1 of the reset program driver 7 that outputs program current which changes the GST of the memory cell 16 to the amorphous state. The pulse width of the set program timing signal WSET_a that determines a timing of flowing the set program current is longer than that of the reset program timing signal WRESET_a that determines a timing of flowing the reset program current.

When the program period 1 is finished, the data holding instruction signals WH_a and WHB_a return to the original state, and the switches TGR1 and TGS1 of the holding circuits S1 and R1 both return to an on (conduction) state. Then, data in the flip-flop circuit 3 is transmitted to the holding circuits S1 and R1. The node NS2 assumes a same potential as the node NR1, and the node NR2 assumes a same potential as the node NS1.

Referring to FIG. 3, the write command "W" is supplied again from the outside, and a program period 2 is entered. A basic operation in this program period 2 is the same as in the program period 1. However, in this example, the same data is written into the same control circuit 2 in the program period 1 and the program period 2. In this case, the data in the holding nodes NS2 and NR2 of the holding circuits S1 and R1 is the same as the data in the output nodes NS1 and NR1 of the flip-flop circuit 3. Thus, the set program driver 6 and the reset program driver 7 do not output the program current.

Finally, when the precharge command "PRE" is supplied from the outside, the memory cell array 1 returns to a precharge state. Then, specification of the bank and the row address specified by the ACT command is canceled, and the memory cell array 1 returns to an idle state. The nodes NR1 and NS1 are also set to the same potential by the equalizer circuit no shown.

As already described, data sensed from the 16K memory cells is respectively stored in the corresponding flip-flop circuits 3 of 16K control circuits 2 by execution of the ACT command.

On the other hand, the column selection signals CSWX_j and CSWY_j determine to which one of the flip-flop circuits 3 of the 16K control circuits 2 data is written by execution of the write command. Accordingly, when the column selection signals CSWX_j and CSWY_j connected to each control circuit 2 are changed as necessary, the data supplied from the outside can be written to the flip-flop circuit 3 of an arbitrary one of the control circuits connected in parallel. The memory cells 16 selected by the ACT command remain in a state of selection by the ACT command, at a time of execution of the write command as well. Data for the memory cell 16 alone, which is connected to the control circuit 2 where data at the corresponding flip-flop circuit 3 has been rewritten, is programmed according to the write command. Assume that data is written into an arbitrary one of the flip-flop circuits 3 alone from the outside using the column selection signals CSWX_j and CSWY_j. Then, a column address signal does not need to be involved in the set program driver 6 and the reset program driver 7. Just by supplying the common reset program timing signal WRESET_a and the common set program timing signal WSET_a from the bit line control signal generation circuit 11 to select an arbitrary one of the memory cells, the data can be written. Accordingly, a circuit configuration and routing for write control can be greatly simplified, and the circuit size can be reduced. Further, the program current flows only through the control circuit 2 in which data in the flip-flop circuit 3 has been rewritten. Thus, the program current can be reduced.

In a DDRSDRAM, for example, a portion of bits (such as eight bits) of bit data (of 32 bits, for example) supplied from an outside can be masked to perform a write operation, according to a write mask enable signal DM. Such an operation can be implemented by connecting the column selection signal CSWY_j for every eight control circuits 2 in the row direction, and by controlling the column control signal CSWY_j, according to the present invention. Such an operation can be implemented without changing the signals output by the bit line control signal generation circuit 11 in the first example shown in FIGS. 1 and 2 and circuit configurations of the set program driver 6 and the reset program driver 7.

In the first example, each of the set program driver 6 and the reset program driver 7 is formed by cascoding three NMOS transistors (TNS1, TNS2, and TNS3 in the set program driver 6, and TNR1, TNR2, and TNR3 in the reset program driver 7) to which three signals are supplied, as a preferred circuit. The three signals are constituted from signals at an output node of the flip-flop circuit 3, the holding node of a corresponding one of the holding circuits S1 and R1, and the program timing signal. The circuit configuration of each of the set program driver 6 and the reset program driver 7 is simplified as a configuration that outputs the program current when all of the three signals go high. While the three NMOS transistors are cascoded, only one PMOS transistor that receives the program timing signal is provided. Thus, the circuit configuration is not a complete CMOS configuration. The circuit configuration is a so-called AND logic circuit configuration for source selection control. Accordingly, in a period in which the program timing signal is high, each of an output node NR3 and the output node NS3 may assume a high impedance. However, the period in which the program timing signal is high is short. Thus, unless the cascoded three NMOS transistors turn on (conduct), each of the nodes NR3 and NS3 keeps high level. Accordingly, the set program driver 6 and the reset program driver 7 can be simplified, as shown in FIG. 2. The order of series connection of the three transistors is arbitrary.

The circuit configuration of each of the set program driver 6 and the reset program driver 7 in FIG. 2 is a preferred example. The circuit configuration of each of the set program driver 6 and the reset program driver 7 in the present invention is not, however, necessarily limited to the configuration in the example. The current source circuits IR1 and IS1 may be provided on a low-potential side rather than a high-potential side, and programming may be performed by drawing current from the memory cell 16. In such a case, flow-in of the program current may be controlled by cascoding of PMOS transistors rather than cascading of the three NMOS transistors. In the example, there is shown an example where the transistors are formed of the MOS transistors. The MOS transistors shown in the example may be replaced by other functional elements each having a switch function.

SECOND EXAMPLE

Figure 5:
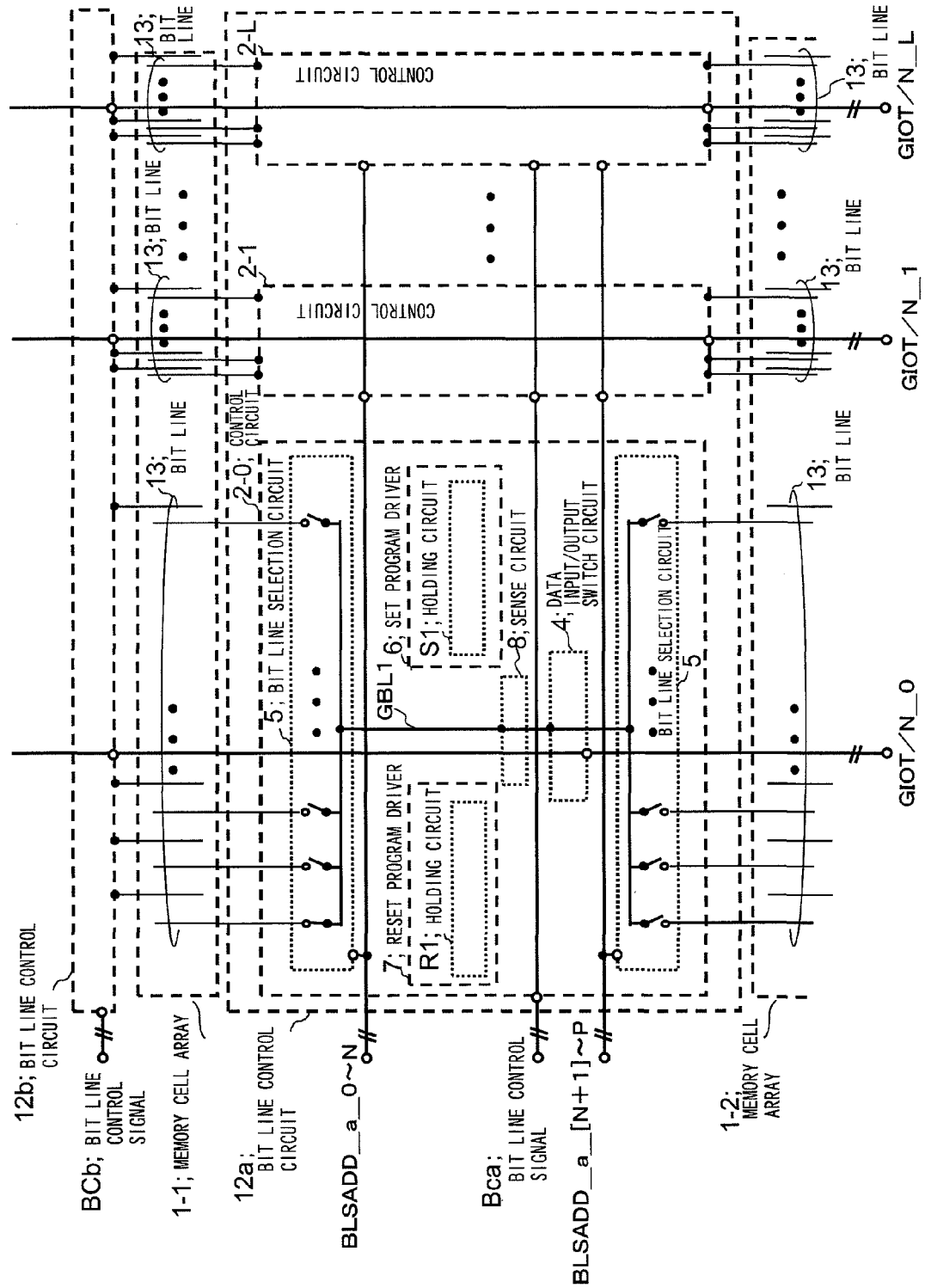
FIG. 5 is a block diagram of a main portion of a semiconductor memory device according to another example of the present invention.

In the first example, description was directed to an example where the bit line control circuit 12 is disposed on only one side of the memory cell array 1. Bit line control circuits (12a and 12b) may be disposed on both sides of a memory cell array 1 in a bit line direction, as shown in FIG. 5. Bit lines 13 of a memory cell array 1-1 sandwiched between the bit line control circuits 12a and 12b may be alternatively routed from the two bit line control circuits 12a and 12b that sandwich the memory cell array 1-1. Then, one memory cell array 1-1 may be controlled by the two bit line control circuits 12a and 12b.

In this case, one bit line control circuit (12a, for example) shown in FIG. 5 controls two adjacent memory cell arrays (1-1 and 1-2, for example) on both sides of a bit line direction. Bit line selection address signals BLSADD_a_0 to BLSADD_a_N corresponding to the memory cell array 1-1 are routed, and bit line selection address signals BLSADD_a_[N+1] to BLSADD_a_P corresponding to the memory cell array 1-2 are routed, and one of the bit line selection address signals for the memory cell arrays 1-1 and 1-2 is selected by a row address. With this arrangement, the bit line control circuit 12a selects one of the two adjacent memory cell arrays (1-1 and 1-2) on both sides of the bit line selection, and activates the selected memory cell array. A word line 15 of the selected memory cell array 1 is simultaneously activated.

In the second example as well, a plurality of bit control signals (such as BCa or BCb) are routed to control circuits 2 in each row from a bit line control signal generation circuit 11, as in the first example. Then, the bit control signals control a sense circuit 8, a set program driver 6, and a reset program driver 7, and the like, as in the first example.

In each of the above-mentioned examples, the bit line selection circuit 5 is provided, and one control circuit 2 is provided for a plurality of the bit lines 13. In view of wiring pitches of the bit lines 13 and the area necessary for disposing each control circuit 2, the above-mentioned configuration is preferable. The bit line selection circuit 5, however, is not an essential requirement in the present invention. If the layout is allowed, the control circuit 2 may be provided for each bit line 13.

The present invention can be further applied to a memory circuit that is implemented as a part of functions of a system LSI as well as to the discrete semiconductor memory device. In the system LSI, the functions are integrated into one chip. A command supplied from the outside in this case may be the one supplied to the memory circuit from other functional block included in the system LSI rather than the one supplied from outside the system LSI. The present invention can be provided to various logic devices, semiconductor devices, and semiconductor systems including memory cells. The present invention can be, for example, applied to an SOC (system on chip), an MCP (multi-chip package), a POP (package on package), an MCU (memory control unit), and the like as well.

The above description was directed to the present invention, and more particularly to the preferred examples for phase change memories. The invention is not limited to a phase-change memory. The invention is suitable for a memory in which the number of times of writing is limited and a non-volatile semiconductor memory device that needs current consumption for writing. The invention can also be applied to a resistance change type element referred to as an ReRAM (resistance random access memory), for example. The invention can be further applied to a non-volatile memory device of a structure using other theory. Further, according to the present invention, only data in one of the flip-flop circuits respectively connected to the different bit lines in which data is to be rewritten is programmed into the memory cell. Thus, if writing is performed by selecting one of the flip-flop circuits, there is no need for specifying a column from the outside in order to perform writing into the memory cell from the flip-flop circuit. Accordingly, a write control circuit of the semiconductor memory device can be simplified.

The above description was directed to the examples. The present invention is not, however, limited to the configurations of the above-mentioned examples alone, and of course includes various variations and modifications that could be made by those skilled in the art within the scope of the present invention. In the above examples, definitions of set and reset may be inverted, and definitions of information 1 and 0 may be inverted. Further, in the above examples, the MOS transistors were employed as transistors used in the respective units. The transistors may be field effect transistors (FETs: Field Effect Transistors), and various transistors such as MISs (Metal-Insulator Semiconductors), TFTs (Thin Film Transistors) may be used. The PMOS transistor (P-type channel MOS transistor) is a typical example of a transistor of a first conductivity type, while the NMOS transistor (N-type channel MOS transistor) is a typical example of a transistor of a second conductivity type.

INDUSTRIAL APPLICABILITY

The present invention is particularly suitable for the phase-change memory. The invention is not, however, limited to the phase-change memory. An effect of reducing a stress and current consumption due to writing may be obtained, and decoding of a write bit selection circuit may be facilitated. Thus, the invention can be extensively used for a non-volatile semiconductor memory device other than the phase-change memory, and further for a field of a semiconductor memory device other than the non-volatile semiconductor memory device.

What is claimed is:

1. A semiconductor memory device comprising:
    a memory cell array comprising a plurality of memory cells; and
    a control circuit that performs control of reading data from and writing data into each of the memory cells;
    the control circuit comprising:
    a flip-flop circuit that stores the data read from the memory cells and stores the data from an outside to be written into the memory cells; and
    a dynamic type holding circuit connected to the flip-flop circuit through a switch, the dynamic type holding circuit temporarily storing the data read from the memory cells,
    wherein said control circuit writes the data in the flip-flop circuit into the memory cell(s) when the data read from the memory cells and then held in the holding circuit is different from the data in the flip-flop circuit to be written, supplied from the outside at a time of writing into the memory cell(s).

2. The semiconductor memory device according to claim 1, wherein
    the holding circuit includes at least a parasitic capacitance of a transistor that is the switch, and holds the data read from the memory cell for a predetermined period of time by the parasitic capacitance.

3. The semiconductor memory device according to claim 2, wherein
    the holding circuit further includes a capacitor, and holds the data read from the memory cell(s) for the predetermined period of time by the capacitor.

4. The semiconductor memory device according to claim 2, wherein the temporary period of time in which the parasitic capacitance or the capacitor holds the data corresponds to at least a time taken for writing the data into the memory cell(s).

5. The semiconductor memory device according to claim 1, wherein the semiconductor memory device comprises a plurality of the control circuits;

each of the control circuits is connected to different bit lines in the memory cell array;

when an active (ACT) command that selects the memory cell array is supplied from the outside, data in the memory cells in the memory cell array, read from the different bit line(s) in parallel is respectively stored in the flip-flop circuits of the control circuits; and when a write command is given from the outside after supply of the active (ACT) command, data from the outside to be written is respectively stored in a predetermined number of the flip-flop circuits of the control circuits specified by the write command, and then the data stored in the predetermined number of the flip-flop circuits is written into the memory cell(s).

6. The semiconductor memory device according to claim 5, wherein the control circuits further comprise data input/output switch circuits that connect the flip-flop circuits and data lines according to corresponding selection signals respectively, the predetermined number of the data input/output switch circuits selectively turn on according to the corresponding selection signals in response to the write command at a time of a writing operation, and the data from the outside is stored in the corresponding number of the flip-flop circuits through a corresponding one or more of the data lines.

7. The semiconductor memory device according to claim 5, wherein each of the control circuits further comprises:

a bit line selection circuit that selects one of corresponding bit lines through which each of writing and reading is performed according to a bit line selection address signal;

a sense circuit that amplifies the data read from the memory cell(s) through the bit line selection circuit, in response to a sense timing signal and stores the amplified data in the flip-flop circuit; and a program driver circuit that writes the data from the outside into the memory cells in response to a program timing signal when the data read from the memory cell(s) and then held in the holding circuit is different from the data from the outside to be written, held in the flip-flop circuit.

8. The semiconductor memory device according to claim 7, wherein a data holding instruction signal that controls conduction of the switch, the bit line selection address signal, the sense timing signal, and the program timing signal are connected in common to a plurality of the control circuits.

9. The semiconductor memory device according to claim 7, wherein selection elements corresponding to output signals of the program driver circuit, the holding circuit, and the flip-flop circuit are connected to one another in series, and the holding circuit and an AND logic of the selection elements control the program driver.

10. The semiconductor memory device according to claim 7, wherein the holding circuit further comprises:

a first holding circuit that holds non-inverted (positive logic) data of the flip-flop circuit; and a second holding circuit that holds inverted (negative logic) data of the flip-flop circuit;

wherein the program driver circuit comprises:

a first program driver circuit; and a second program driver circuit;

wherein the first program driver circuit comprises:

a first inverter including a first transistor of a first conductivity type and a first transistor of a second conductivity type, the first inverter receiving a first timing signal as said program timing signal and then outputting a first writing pulse;

a first program transistor that receives the first writing pulse, flows current through the bit line, and performs first programming into the memory cell;

a second transistor of the second conductivity type connected in series with a source of the first inverter, with a gate thereof connected to an inverting output terminal of the flip-flop circuit; and a third transistor of the second conductivity type with a gate thereof connected to a holding terminal of the first holding circuit;

the first program driver circuit being configured to turn on when all of the first to third transistors of the second conductivity type turn on; and wherein the second program driver circuit comprises:

a second inverter including a second transistor of the first conductivity type and a fourth transistor of the second conductivity type, the second inverter receiving a second timing signal as said program timing signal and then outputting a second writing pulse;

a second program transistor that receives the second wring pulse, flows current through the bit line, and performs second programming different from the first programming into the memory cell;

a fifth transistor of the second conductivity type connected in series with a source of the second inverter, with a gate thereof connected to a non-inverting output terminal of the flip-flop circuit; and a sixth transistor of the second conductivity type with a gate thereof connected to a holding terminal of the second holding circuit;

the second program driver circuit being configured to turn on when all of the fourth to sixth transistors of the second conductivity type turn on.

11. The semiconductor memory device according to claim 10, wherein a source of the first program transistor is connected to a first power supply through a first constant current circuit, and a source of the second program transistor is connected to the first power supply through a second constant current circuit.

12. The semiconductor memory device according to claim 1, wherein each of the memory cells is a non-volatile memory cell.

13. The semiconductor memory device according to claim 1, wherein the memory cells are memory cells of variable resistance type or phase change type.

14. A semiconductor memory device comprising:

a plurality of memory cell arrays arranged in a matrix form, each of the memory cell arrays comprising a plurality of memory cells connected to a plurality of word lines and a plurality of bit lines, respectively;

a plurality of bit line control circuits respectively disposed corresponding to the memory cell arrays, each of the bit line control circuits performing control so that data in a corresponding one of the memory cells is read and written through each bit line;

a plurality of data lines connected in common to a plurality of the bit line control circuits respectively arranged in a first direction, the first direction being an extending direction of the bit lines; and a plurality of bit line control signal generation circuits connected in common to a plurality of the bit line control circuits respectively arranged in a second direction, the second direction being an extending direction of the word lines;

wherein each of the bit line control circuits in the first direction comprises a plurality of control circuits each connected to a different one of the data lines and different ones of the bit lines of a corresponding one of the memory cell arrays;

wherein each of the control circuits comprises:

a flip-flop circuit that stores the data read from the corresponding one of the memory cells and stores data from an outside to be written into the corresponding one of the memory cells; and a dynamic type holding circuit that is connected to the flip-flop circuit through a switch and temporarily holds the data read from the corresponding one of the memory cells;

wherein each of the control circuits writes the data in the flip-flop circuit into the corresponding one of the memory cells when the data read from the corresponding one of the memory cells and then held in the holding circuit is different from the data from the outside to be written, stored in the flip-flop circuit at a time of writing; and wherein a signal that controls conduction of the switch and a signal that controls a timing signal of writing the data in the flip-flop circuit into the corresponding one of the memory cells are connected in common to a plurality of the control circuits included in each of the bit line control circuits extending from each of the bit line control signal generation circuits in the second direction.

15. The semiconductor memory device according to claim 14, wherein the control circuits further include:

data input/output switch circuits each of which connects a corresponding one of the flip-flop circuits and a corresponding one of the data lines;

wherein the data from the outside is stored in the flip-flop circuit through a selected one of the data input/output switch circuits through the corresponding one of the data lines at the time of writing; and wherein the data in the corresponding one of the memory cells is output to the corresponding one of the data lines from the flip-flop circuit through the selected one of the data input/output switch circuits at a time of reading.

16. The semiconductor memory device according to claim 15, wherein the connection between the corresponding one of the flip-flop circuits and the corresponding one of the data lines by the data input/output switch circuit is controlled by a first selection signal routed in common with other ones of the bit line control circuits arranged in the first direction and a second selection signal routed in common with other ones of the bit line control circuits arranged in the second direction.

17. The semiconductor memory device according to claim 14, wherein the memory cells are non-volatile memory cells.

18. The semiconductor memory device according to claim 14, wherein the memory cells of the memory cell array are memory cells of a variable resistance type or a phase change type.

* * * * *